(12) United States Patent
Schaeffer et al.

(10) Patent No.: US 6,344,686 B1
(45) Date of Patent: Feb. 5, 2002

(54) POWER ELECTRONIC COMPONENT INCLUDING COOLING MEANS

(75) Inventors: Christian Schaeffer, Le Pin; Michel Mermet-Guyennet, Aurensan, both of (FR)

(73) Assignee: Alstom Holdings, Paris (FR)

( * ) Notice: Subject to any disclaimer, the term of this patent is extended or adjusted under 35 U.S.C. 154(b) by 0 days.

(21) Appl. No.: 09/447,832

(22) Filed: Nov. 23, 1999

(30) Foreign Application Priority Data

Nov. 27, 1998 (FR) ............................................ 98 15155

(51) Int. Cl.$^7$ .............................................. H01L 23/34
(52) U.S. Cl. ........................ 257/712; 257/712; 257/706; 257/714
(58) Field of Search ................................ 257/712, 714, 257/706, 772, 779, 780, 781

(56) References Cited

U.S. PATENT DOCUMENTS

| | | | | |
|---|---|---|---|---|
| 3,652,903 A | * | 3/1972 | Eriksson et al. ............ | 257/726 |
| 3,663,184 A | * | 5/1972 | Wood et al. ................. | 428/620 |
| 3,784,885 A | * | 1/1974 | Weidmann ................... | 257/714 |
| 4,392,153 A | * | 7/1983 | Glascock, II et al. ....... | 257/746 |
| 4,520,305 A | * | 5/1985 | Cauchy ....................... | 322/2 R |
| 4,758,926 A | * | 7/1988 | Herrell et al. .............. | 257/714 |
| 4,774,630 A | * | 9/1988 | Reisman et al. ............. | 257/712 |
| 4,879,629 A | * | 11/1989 | Tustaniwskyj et al. ..... | 361/699 |
| 5,168,537 A | * | 12/1992 | Rajasekharan et al. ...... | 385/89 |
| 5,323,292 A | * | 6/1994 | Brzezinski .................. | 361/689 |
| 5,495,889 A | * | 3/1996 | Dubelloy .................... | 257/714 |
| 5,504,378 A | * | 4/1996 | Lindberg et al. ........... | 307/10.1 |
| 5,550,407 A | * | 8/1996 | Ogashiwa .................... | 257/737 |
| 5,684,677 A | * | 11/1997 | Uchida et al. .............. | 361/770 |
| 5,774,334 A | * | 6/1998 | Kawamura et al. ......... | 257/714 |
| 5,790,376 A | * | 8/1998 | Moore ........................ | 361/700 |
| 5,829,516 A | * | 11/1998 | Lavochkin ................. | 165/80.4 |
| 5,831,336 A | * | 11/1998 | Digiacomo ................. | 257/779 |

FOREIGN PATENT DOCUMENTS

| | | |
|---|---|---|
| EP | 0 871 352 A1 | 10/1998 |
| FR | 2 737 608 A1 | 2/1997 |
| GB | 2018022 A * | 10/1979 |
| GB | 43 11 839 A1 | 10/1994 |
| JP | 08241943 A * | 9/1996 |

OTHER PUBLICATIONS

Kazuo Tsubouchi et al.: "Theoretical Analysis for a New Package Concept: High–Speed Heat Removal for VLSI Using and AIN Heat–Spreading Layer and Microchannel Fin", Japanese Journal of Applied Physics, col. 30, NR. 1B, pp. L88–L91, XP000223790 ISSN: 0021–4922.

Database Inspec Online! Institute of Electrical Engineers, Stevenage, GB, Perret, C. et al.: "Microchannel Integrated heat sinks in silicon technology" Database Accession No. 6161880 XP00210745 & Conference Record of 1998 IEEE Industry Applications Conference. Thirty–Third IAS Annual Meeting (CAT. NO> 98CH36242), St. Louis, MO, USA, Oct. 12–15 199, pp. 1051–1055, vol. 2, 1998, New York, NY, USA, IEEE, USAISBN: 0–7803–4943–1.

* cited by examiner

*Primary Examiner*—Eddie Lee
*Assistant Examiner*—Chris Chu
(74) *Attorney, Agent, or Firm*—Sughrue Mion, PLLC

(57) ABSTRACT

The power electric component comprises first and second heat transfer and electrical insulation composite structures and at least one power semiconductor circuit which has connecting terminals. The first composite structure includes respective conductive or semiconductor layers adjacent to the semiconductor circuit and conductive or semiconductor layers opposite to the semiconductor circuit. The connecting terminals are attached on the side opposite the first composite structure to a plane array of mutually insulated conductive members, wherein the array is integrated into the second composite structure which includes a conductive or semiconductor layer opposite to the semiconductor circuit. The opposite layer of at least the first composite structure or the second composite structure includes flow passages for a heat transfer fluid so that the component can be cooled from its top and bottom faces.

10 Claims, 4 Drawing Sheets

POWER ELECTRONIC COMPONENT INCLUDING COOLING MEANS

The present invention concerns a power electronic component.

BACKGROUND OF THE INVENTION

Power electronic components, which are used in particular to construct inverters for rail traction, usually comprise a substrate made of copper, for example. Composite conductor-insulator-conductor structures which have a heat transfer and electrical insulation function are attached to the substrate. They are in the form of a direct bonded copper (DBC) copper-ceramic-copper stack. These composite structures can also be in the form of insulated metal substrates (IMS) which comprise an aluminum or copper bottom layer, an epoxy intermediate layer and a copper top layer which may be formed in several parts.

A plurality of power semiconductor circuits are disposed on each composite structure, for example insulated gate bipolar transistors (IGBT) or diodes. One side of the semiconductor circuits is covered with connecting terminals and the circuits are fixed to the free metal layer of the composite structure on the side with no terminals. The circuits are fixed using tin-lead or tin-lead-silver soft solder, for example.

Aluminum wires typically having a diameter in the range from 380 to 500 microns are then soldered to each connecting terminal. Each of these wires is also soldered to the top metal layer of the composite structure. The assembly of the substrate, the composite structures and the power semiconductor circuits is then placed in a casing filled with silicone gel and covered with an epoxy resin cap to form a power electronic component.

The component is usually placed on a cooling unit which can be a water-cooled plate, an air heat exchanger or a "heatpipe" evaporator base. This unit is designed to maintain the temperature of the power electronic component below 125° C. to maintain its integrity.

The cooling problem is especially critical in the field of power electronic components because the threshold temperature of around 125° C. determines the current rating of the component.

In particular, to increase the nominal current capacity of such components it is necessary to increase the quantity of semiconductor material used, which obviously increases the unit cost.

OBJECTS AND SUMMARY OF THE INVENTION

The object of the invention is therefore to improve the cooling of power electronic components in order either to increase the current rating for a given volume and therefore unit price or to reduce the volume and therefore the unit price for a given nominal current.

The invention proposes in particular to provide a power electronic component whose overall structure is different from that of prior art components, and thereby to improve cooling.

To this end, the invention consists in a power electronic component comprising a first heat transfer and electrical insulation composite structure supporting at least one power semiconductor circuit whose side opposite said first composite structure has connecting terminals, said first composite structure including respective conductive or semiconductor layers adjacent and opposite said semiconductor circuit, wherein said connecting terminals are attached on the side opposite said first composite structure to a plane array of mutually insulated conductive members, said array being integrated into at least a second heat transfer and electrical insulation composite structure which includes a conductive or semiconductor layer opposite said semiconductor circuit, and wherein the opposite layer of at least the first composite structure or the second composite structure comprises flow means for a heat transfer fluid.

According to other features of the invention:

the layer opposite the semiconductor circuit is made of a semiconductor material, in particular of silicon;

the semiconductor layer opposite the semiconductor circuit comprises first and second wafers assembled together, at least one of the wafers having grooves, and the heat transfer fluid flow means comprise through passages in said layer opposite the semiconductor circuit, the passages being formed by co-operation of shapes between the wafers;

the plates have respective series of grooves and the passages are formed by co-operation of shapes between said facing grooves on respective opposite sides of the junction plane of the two wafers;

the passages have a hexagonal cross-section;

the layer opposite the semiconductor circuit is made of a metallic material;

the heat transfer fluid flow means open onto the distal face of the metallic layer opposite the power semiconductor circuit;

the flow means comprise at least one passage extending over at least a portion of at least one dimension of the metallic layer opposite the semiconductor circuit;

the terminals are attached to the plane array of the second composite structure by soldering at least one tin-lead-silver boss;

the terminals are separated from the or each boss by a coating adhering to the or each boss, in particular a titanium-nickel-gold deposit.

BRIEF DESCRIPTION OF THE DRAWINGS

The invention is described below with reference to the accompanying drawings which are given by way of non-limiting example only and in which.

MORE DETAILED DESCRIPTION

Figure 1:
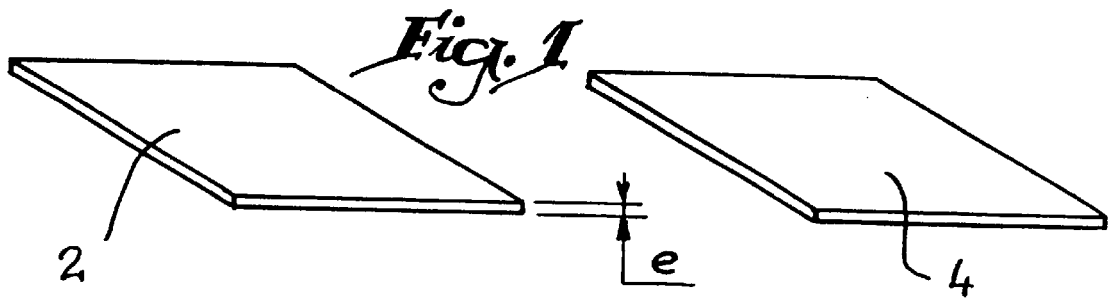
FIGS. 1 to 3 are diagrams showing the production of a layer forming part of a composite structure included in a power electronic component in accordance with the invention.
Figure 2:
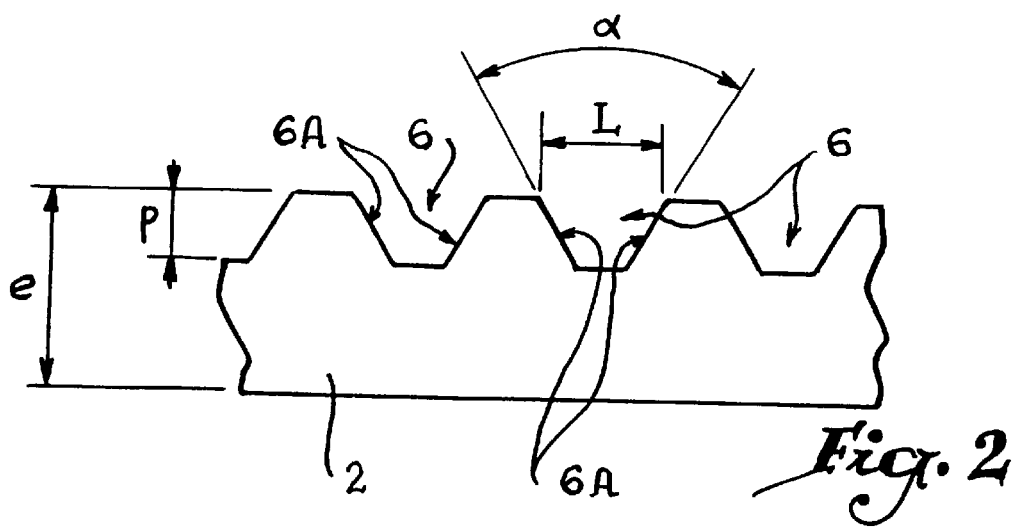
Figure 3:
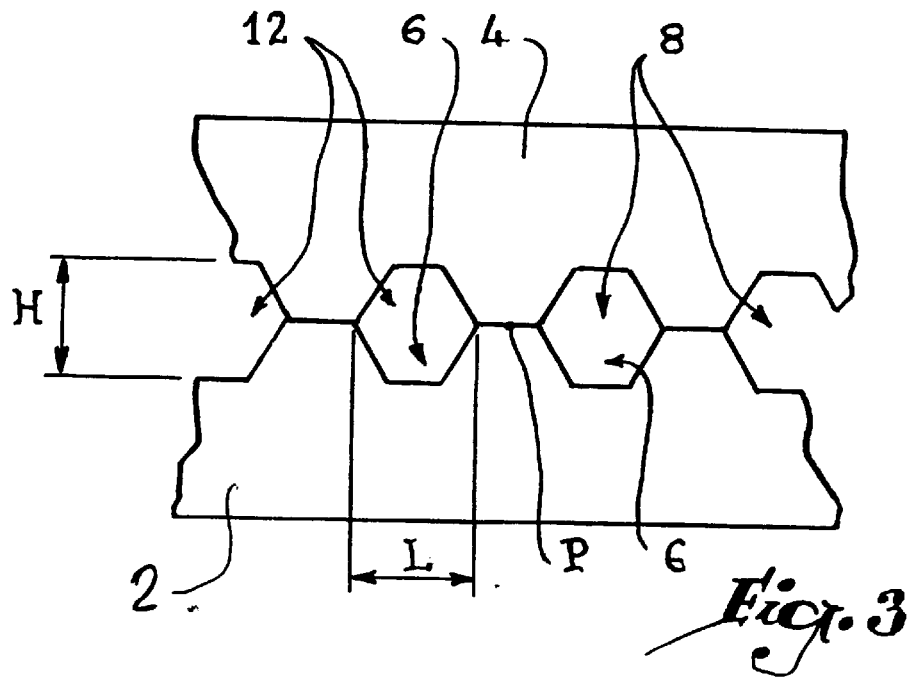

FIGS. 1 to 3 show the production of a semiconductor layer to be integrated into a power electronic component in accordance with the invention. The process uses two monocrystalline silicon wafers shown in FIG. 1 and referred to by convention as the first wafer 2 and the second wafer 4. They have similar dimensions, namely a thickness e of approximately 1 mm and main dimensions of approximately 50 mm by 50 mm.

As shown in FIG. 2, the next step is to form grooves 6 in the first wafer 2. The grooves are formed by a wet chemical etching process, in a manner that is well-known in the art. Given the nature of monocrystalline silicon, this operation is particularly easy and forms grooves having a U-shaped profile with inclined flanks, the etching being effected along the crystal planes. The angle a defining the inclination of the flanks 6A of the grooves is close to 57°. The grooves are parallel to one of the main directions of the wafer and between two of its opposite edges.

Etching is stopped when the depth p of the groove 6 is equal to approximately half its width L. In the embodiment shown, approximately 50 grooves are formed on the wafer 2, which corresponds to a density of approximately 10 grooves per cm. The grooves 6 can equally well be V-shaped.

FIG. 2 shows only the formation of the grooves 6 on the wafer 2, it being understood that in the embodiment described analogous grooves 8 are formed on the second wafer 4.

The next step is to assemble the two wafers 2 and 4 together. To this end, the respective series of grooves 6, 8 are lined up with each other after which the two wafers are welded together. This operation is carried out at a temperature of approximately 600° C.

The layer 10 is formed by assembling the two wafers 2 and 4 together in this way. It has a multiplicity of passages 12 formed by co-operation of the shapes of the facing grooves 6 and 8 in the respective wafers 2 and 4. The passages 12 are on respective opposite sides of the joint plane P between the two wafers 2, 4, are substantially hexagonal and have a width L substantially equal to their height H. The passages are through passages in the sense that they extend from one of the two opposite edges of the layer 10 to the other one.

In this example, the grooves are formed within the two wafers 2 and 4. The grooves can also be formed on only one wafer, in which case the passages are formed by the grooves and the plane surface of the other wafer.

Figure 4:
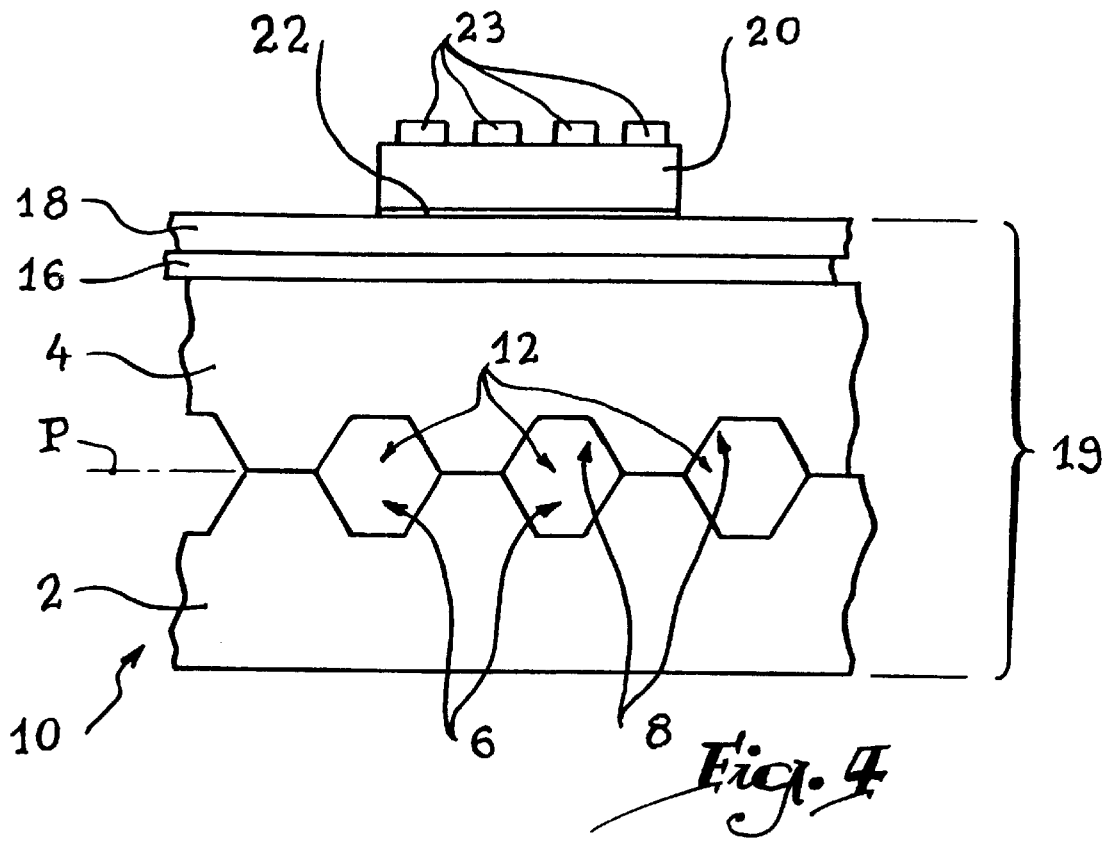
FIG. 4 is a diagram showing the composite structure formed from the layers shown in FIGS. 1 to 3 and a power semiconductor circuit on that structure.

As shown in FIG. 4, an insulative silica layer 16 is then placed on top of the layer 10 and an additional monocrystalline silicon layer 18 is placed on it, to form a composite structure 19. The structure 19 including the layers 10, 16 and 18 is produced in a conventional manner using thin film deposition and electrolytic processes well known in the electronics art.

A power semiconductor circuit 20 such as an IGBT or a diode is conventionally attached to the free face of the layer 18 by means of a layer 22 of tin-lead solder. Note that, unlike standard power electronic components, the terminals 23 of the circuit 20 are not connected to the layer 18 by aluminum wires.

Figure 5:
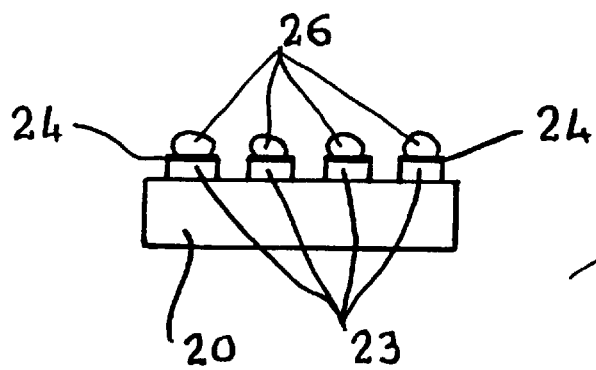
FIG. 5 is a diagram to a larger scale showing the semiconductor circuit from FIG. 4.

FIG. 5 shows a subsequent step in the production of a power electronic component in accordance with the invention, which consists firstly in depositing a multilayer titanium-nickel-gold coating 24 approximately 0.8 micrometers thick on the free face of the terminals 23 by means of a spraying process, for example.

A tin-lead-silver boss 26 is placed on the multilayer coating 24, its size corresponding to that of the terminal 12.

In this example, the boss contains approximately 2% tin, 95.5% lead and 2.5% silver. Note that the multilayer coating 24 achieves excellent mechanical adhesion of the boss 26 to the terminal 23.

The next step is to produce a second composite structure 119 which is to have a heat transfer and electrical insulation function.

The structure 119 comprises layers 110 and 116 identical to the layers 10 and 16 of the structure 19. The layer 116 is covered with a plane array 118 of mutually insulated conductive members whose configuration matches that of the semiconductor circuit 20 that the plane array 118 is to cover.

The second structure 119 is then turned over and its plane array 118 brought into contact with each boss 26 on the terminals 23 of the power semiconductor circuit 20. Each boss 26 is then melted by heating it to approximately 330° C. for 10 seconds, for example. This attaches the terminals 23 to the plane array 118 of the composite structure 119. The array 118 is referred to hereinafter as the adjacent array, as opposed to the layer 110 which is referred to hereinafter as the opposite layer.

The resulting power electronic component 28 can then be cooled by the layers 10 and 110. The passages 12 and 112 therein convey a gaseous or liquid heat transfer fluid and to this end are connected to a source of such fluid.

The conformation of the power electronic component 28 of the invention eliminates the need for the aluminum wires usually employed in prior art components. Here, the plane array 118 of the second composite structure 119 has the same function as these aluminum wires.

Figure 7:
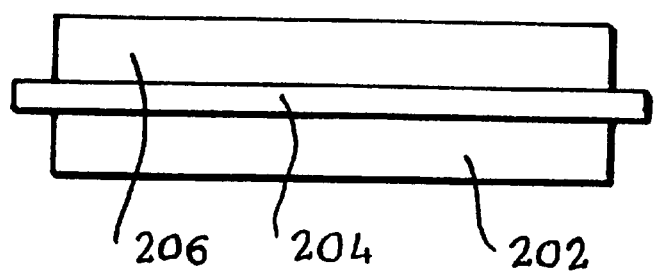
Figure 8:
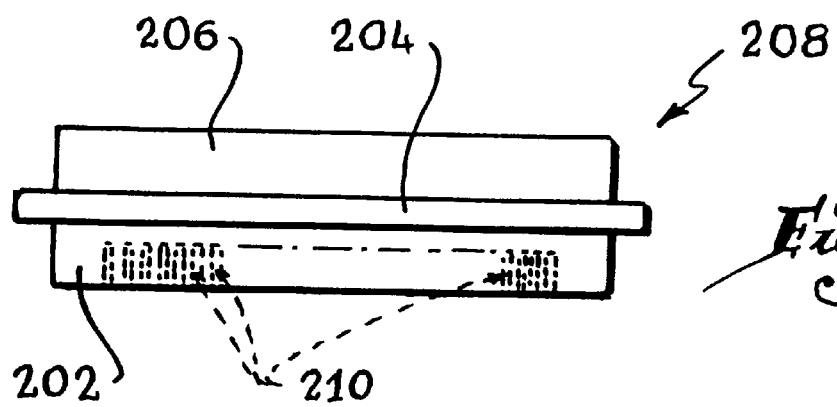
Figure 9:
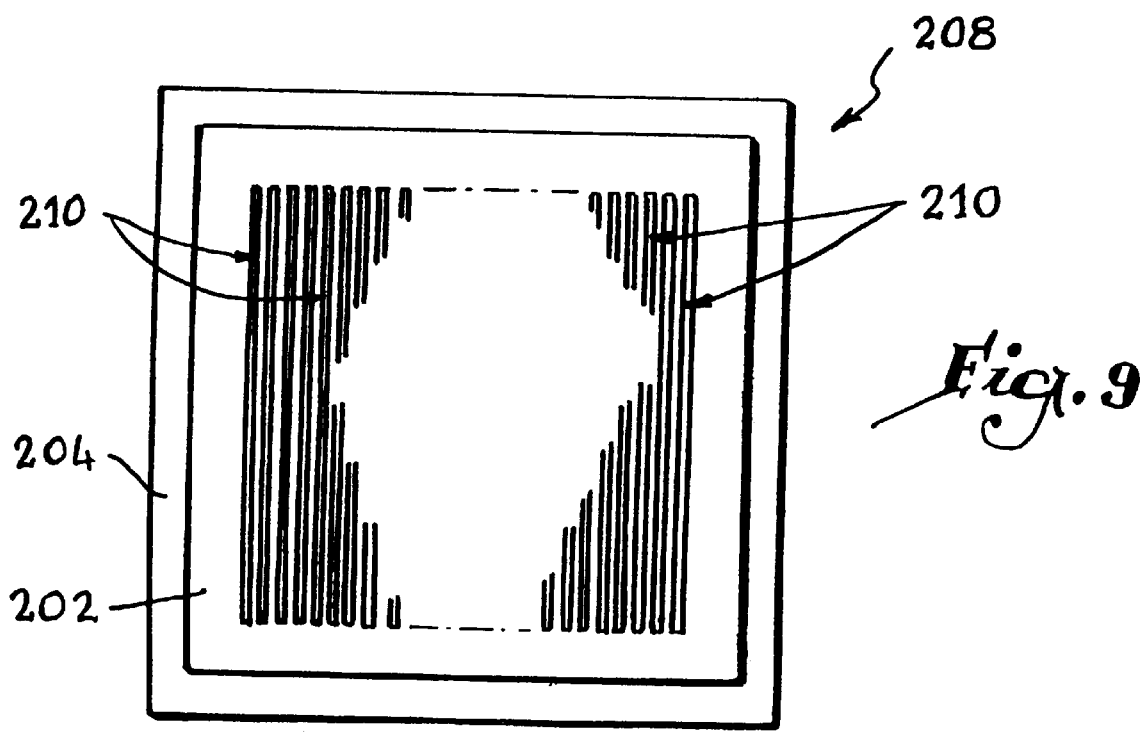

FIGS. 7 to 9 show the execution of another composite structure designed to be integrated into a power electronic component in accordance with the invention.

The process starts with a conductor-insulator-conductor composite structure in the usual conformation shown in FIG. 7. This structure comprises a first or bottom layer 202 of copper, for example, on top of which is an insulative intermediate layer 204 supporting a second or upper metal layer 206, also of copper. The conductive layers 202 and 206 are 3 to 4 mm thick, for example, and have main dimensions of 48 mm by 48 mm. The insulative layer 204 is 0.635 mm thick and has main dimensions 50 mm by 50 mm.

FIGS. 8 and 9 show a composite structure 208 designed to be integrated into a component in accordance with the invention and made from the structure shown in FIG. 7. The bottom layer 202 of the structure 208 has a multiplicity of passages or conduits 210 to constitute heat transfer fluid flow means. The passages are parallel to one of the main dimensions of the bottom layer 202, and start from its bottom face, as shown in FIG. 8 in particular. Each passage extends a substantial part of the thickness of the bottom layer 2, for example to a height in the range from 2 to 3 mm. The passages 210 can also extend throughout the thickness of the bottom layer 202. The passages are 200 micrometers wide and from 40 to 50 mm long, for example. In the embodiment described, there are approximately 50 passages 210 and two adjacent passages are therefore from 200 to 300 micrometers apart.

Figure 10:
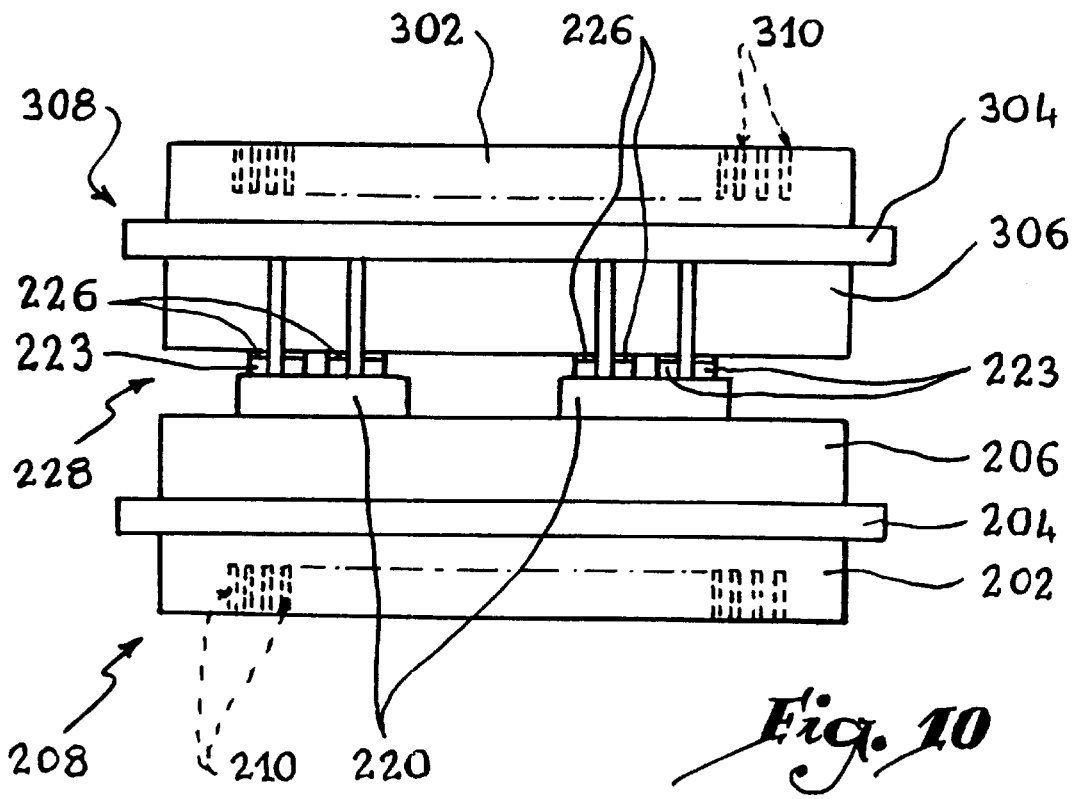
FIG. 10 is a diagram showing a component in accordance with the invention including two structures like that shown in FIGS. 8 and 9.
Figure 6:
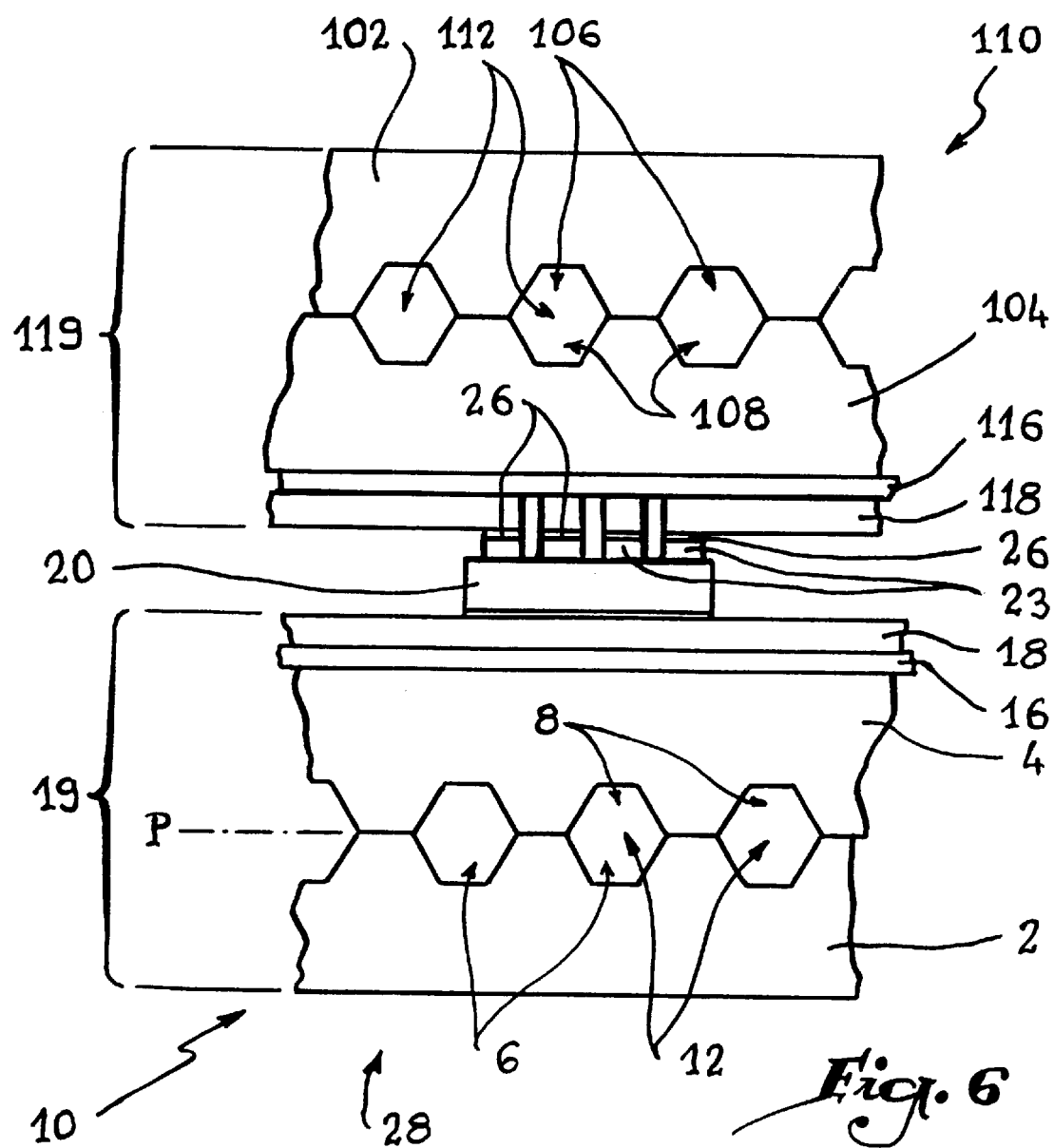
FIG. 6 is a diagram showing a component in accordance with the invention comprising two composite structures like that shown in FIG. 4, FIGS. 7 to 9 are diagrams showing a variant of a composite structure of a power electronic component in accordance with the invention.

As shown in FIG. 10, two power semiconductor circuits 220 identical to the circuit 20 from FIGS. 4 to 6 are then placed on the top layer 206. A tin-lead-silver boss 226 is then placed on each terminal 23 of the semiconductor circuits 220, in a similar manner to that described with reference to FIG. 5.

The next step is to produce a second composite structure 308 which includes layers 302 and 304 identical to the layers 202 and 204.

The layer 304 is covered by a plane array 306 of mutually insulated conductive members whose configuration matches that of the semiconductor circuit 220 that the plane array covers.

The structure 308 is then turned over and its plane array 306 is brought into contact with The boss 226. The latter is then melted, in the manner described with reference to FIG. 6.

This attaches the terminals 223 to the plane array 306 of the second composite structure 308. The array 306 is referred to hereinafter as the adjacent array, as opposed to the layer 302 which is referred to hereinafter as the opposite layer.

The resulting power electronic component 228 can then be cooled by the layers 202, 302 opposite the semiconductor circuit 220. The passages 210, 310 therein can convey a gaseous or liquid heat transfer fluid and to this end are connected to a source of such fluid.

In this example, the passages open onto the distal face of the layers 202 and 302, namely their face at the greater distance from the semiconductor circuit 220.

The power electronic component according to the invention achieves the objectives previously stated. It dispenses with the need for the aluminum wires used in prior art devices. Such wires constitute a limiting factor with regard to cooling, because they are heated in proportion to the square of the current flowing in them, and it is difficult to cool them because they are embedded in the silicone gel. Moreover, the aluminum wires can cause serious malfunctions of the power electronic component as a whole. They are subject in service to heat cycling such that they may rupture.

The component of the invention, apart from the fact that it uses no aluminum wires, assures simultaneous cooling of the power semiconductor circuits constituting it from their top and bottom faces.

Moreover, the composite structures forming the component in accordance with the invention have a cooling function in addition to their usual heat transfer and electrical insulation function. Integrating the cooling element into each composite structure limits the number of interfaces between the various layers constituting the component of the invention. This also increases the coefficient of heat exchange by convection with the heat transfer fluid flowing in the passages formed in the layer opposite each composite structure.

For a given nominal current, this very significantly reduces the volume of silicon required compared to that required for prior art power electronic components. Moreover, for a volume of silicon comparable to that used in a prior art component, the component of the invention has a significantly higher current rating.

What is claimed is:

1. A power electronic component comprising:
    a first heat transfer and electrical insulation composite structure including first and second conductive or semiconductive layers and an insulative layer interposed between said first and second conductive or semiconductive layers;
    at least one power semiconductor circuit disposed on said first conductive or semiconductive layer of said first composite structure, said power semiconductor circuit including a plurality of connecting terminals located on a side opposite said first composite structure; and
    a second heat transfer and electrical insulation composite structure including a plane array of mutually insulated conductive members, a third conductive or semiconductive layer and a second insulative layer interposed between said plane array and said third conductive or semiconductive layer, wherein said connecting terminals are attached said plane array of mutually insulated conductive members, and at least one of the second conductive or semiconductive layer of the first composite structure or the third conductive or semiconductive layer of the second composite structure comprises flow means for a heat transfer fluid.

2. A component according to claim 1, wherein said at least one of said second and third conductive or semiconductive layers is made of a semiconductor material.

3. A component according to claim 2, wherein said at least one of said second and third conductive or semiconductive layers comprises first and second wafers assembled together, at least one of the first and second wafers having grooves, and wherein the heat transfer fluid flow means comprises through passages formed by said grooves when said first and second wafers are assembled together.

4. A component according to claim 3, wherein said first and second wafers have respective series of grooves and the passages are formed by co-operation of shapes between said grooves on respective opposite sides of a junction plane of the first and second wafers.

5. A component according to claim 4, wherein said passages have a hexagonal cross-section.

6. A component according to claim 1, wherein said at least one of said second and third conductive or semiconductive layers is made of a metallic material.

7. A component according to claim 6, wherein said heat transfer fluid flow means open onto a distal face of said at least one of said second and third conductive or semiconductive layers.

8. A component according to claim 7, wherein said flow means comprises at least one passage extending over at least a portion of at least one dimension of said at least one of said second and third conductive or semiconductive layers.

9. A component according to claim 1, wherein said terminals are attached to said plane array of the second composite structure by soldering at least one tin-lead-silver boss.

10. A component according to claim 9, wherein said terminals are separated from the at least one tin-lead-silver boss by a coating adhering to the at least one tin-lead-silver boss.

* * * * *